(12) United States Patent
Ramroopsingh et al.

(10) Patent No.: US 7,358,752 B1
(45) Date of Patent: Apr. 15, 2008

(54) SIGNAL LAUNCH FOR HIGH SPEED DIFFERENTIAL SIGNALS

(75) Inventors: Marlon Ramroopsingh, Attleboro, MA (US); Jason Pritchard, Hopkinton, MA (US)

(73) Assignee: EMC Corporation, Hopkinton, MA (US)

( * ) Notice: Subject to any disclaimer, the term of this patent is extended or adjusted under 35 U.S.C. 154(b) by 120 days.

(21) Appl. No.: 11/276,929

(22) Filed: Mar. 17, 2006

(51) Int. Cl.
  *G01R 31/02* (2006.01)
(52) U.S. Cl. .................. 324/754; 324/761
(58) Field of Classification Search .......... None
  See application file for complete search history.

(56) References Cited

U.S. PATENT DOCUMENTS 5,221,895 A * 6/1993 Janko et al. .......... 324/762

* cited by examiner

*Primary Examiner*—Minh N Tang

(57) ABSTRACT

A differential signal probe-differential signal launch structure wherein the conductive outer housing of the differential signal probe is disposed on and electrically connected to a conductive ground pad disposed on a printed circuit board. A vertically extending ground via is provided with the conductive pad being electrically connected to the horizontally ground plane conductors through the vertically extending ground via.

6 Claims, 6 Drawing Sheets

SIGNAL LAUNCH FOR HIGH SPEED DIFFERENTIAL SIGNALS

TECHNICAL FIELD

This invention relates generally to signal launches and more particularly to signal launches adapted for injecting high-speed differential signals into, or sensing such high speed differential signals in, printed circuit boards (PCBs).

BACKGROUND

As is known in the art, one technique used to inject high-speed differential signals into, or sense such high speed differential signals in, printed circuit boards (PCBs) is to use a differential signal probe such as shown in FIGS. 1A and 1B. Here, a probe 9 has a pair of semi rigid coax cables 10a, 10b, each have an outer ground shield or housing 12 around a central, inner signal conductor or pin 14, each such pin 14 being dielectrically insulated from the other pin 14 and from the outer ground shield 12. The distal end of the probe 9 has a plug/receptacle 16 to which an SMA cable, not shown, can be connected. The signal pins 14 are adapted to connect to a differential signal launch 20 comprising a pair of vertically extending electrically conductive signal vias 22a, 22b having contacts on the upper surface of a printed circuit board (PCB) 26. The signal vias 22a, 22b are electrically connected to a corresponding one of a pair of horizontally extending signal conductors 24a, 24b, respectively, disposed within the PCB 26. The pair of signal conductor 24a, 24b are disposed between a pair of horizontally extending ground plane conductors 28a, 28b, as shown in FIG. 1B. Here, the arrangement is a floating ground arrangement. An arrangement using a reference ground is shown in FIGS. 2A and 2B where a piece of wire 30 is attached at one end to the outer ground conductor of the probe 9 and at the other end to a ground via 32 which passes through the PCB 26 to the ground plane conductors 28a, 28b. The use of a wire creates a large return route thereby degrading your signal.

In another arrangement, a Surface Mount Adapter (SMA) receptacle on the printed circuit board, as shown in FIGS. 5A and 5B. The Surface Mount Adapter is used with the outer shield of the housing grounded to a pad on the printed circuit board. This pad also acts as an anchor point for the component. However, this pad is a fixed distance, depending on the location of the ground leg of the SMA. Because the SMA can be in different configurations, the ground pads are made to suite the anchor points. Further, another disadvantage of this arrangement results from the size of the SMA's footprint. Typically, a 0.975 in×0.975 in area is needed for a differential pair. This limits the amount of signals one can probe on a test board. A differential trace would have to be split to be routed to the center pin thereby causing impedance discontinuities. Further, because of the physical height and size of the connector, there are limitations on where it could be placed and what applications it could be used.

SUMMARY

In accordance with the present invention, a differential signal probe-differential signal launch structure is provided. The structure includes: (A) a differential signal probe having: a semi-rigid conductive outer housing; and a pair of signal pins disposed within and electrically insulated from each other and from the outer housing; and (B) a signal launch. The signal launch includes a printed circuit board with a conductive ground pad disposed on the upper surface of the printed circuit board. A pair of spaced, horizontally extending signal conductors is disposed within the printed circuit board. A pair of signal vias has contacts disposed on the upper surface of the printed circuit board and electrically connected to a corresponding one of the pair of signal pins of the probe. The pair of signal vias extends vertically through the printed circuit board to contact a corresponding one of the pair of horizontally extending signal conductors. A pair of horizontally extending ground plane conductors is disposed within the printed circuit board. The pair of spaced, horizontally extending signal conductors is disposed between horizontally extending ground plane conductors. The structure includes a vertically extending ground via with the conductive pad being electrically connected to the horizontally ground plane conductors through the vertically extending ground via. The conductive outer housing of the differential signal probe is disposed on and electrically connected to the conductive ground pad.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
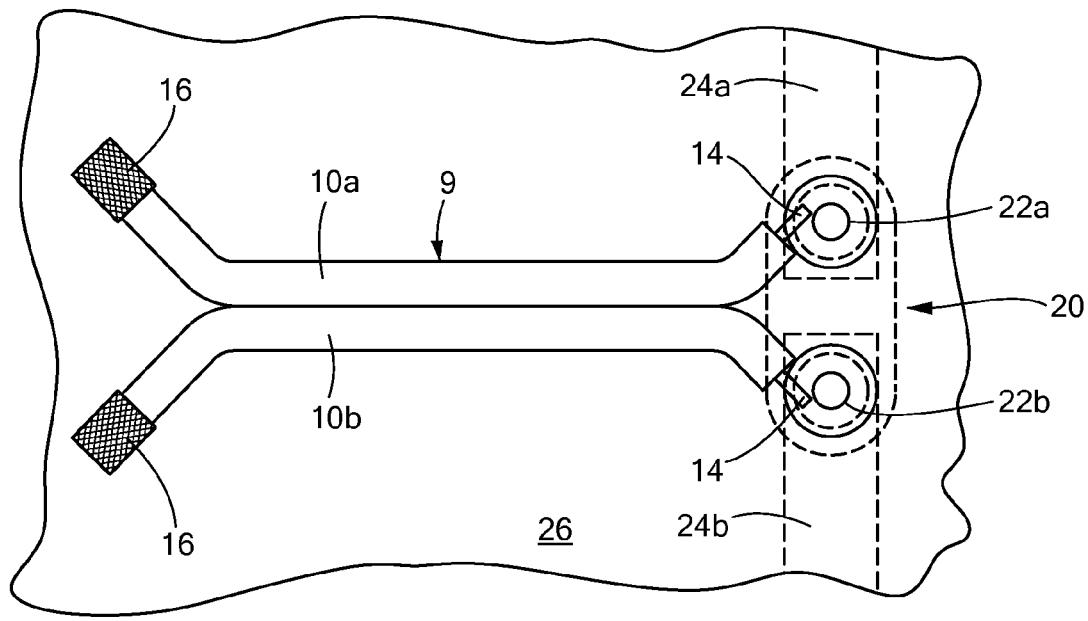
FIG. 1A is a top view a differential signal probe-differential signal launch structure according to the PRIOR ART.
Figure 1B:
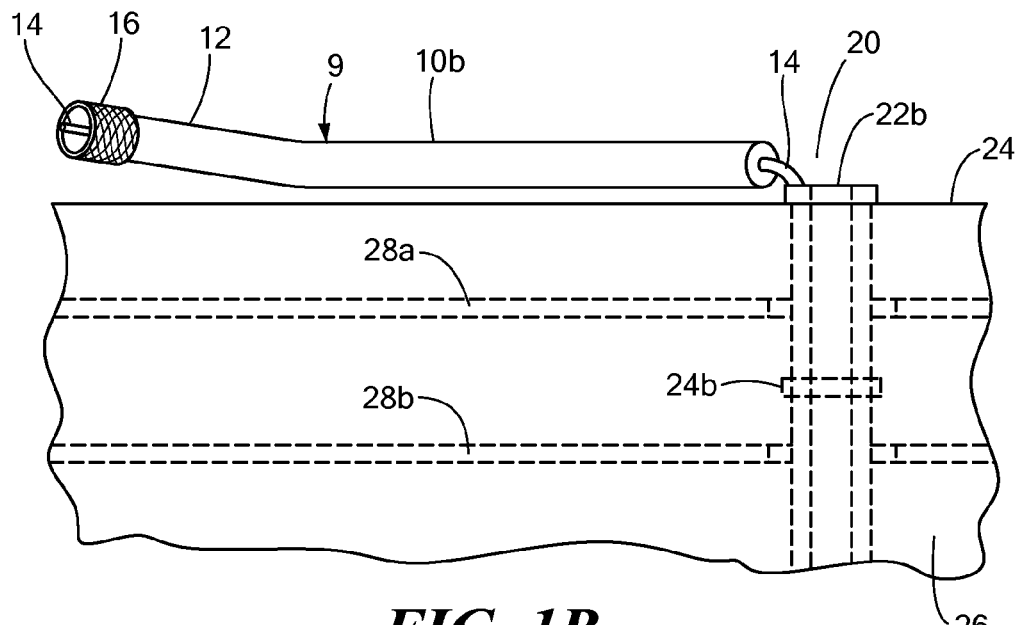
FIG. 1B is a side elevation view of the differential signal probe-differential signal launch structure of FIG. 1A according to the PRIOR ART.
Figure 2A:
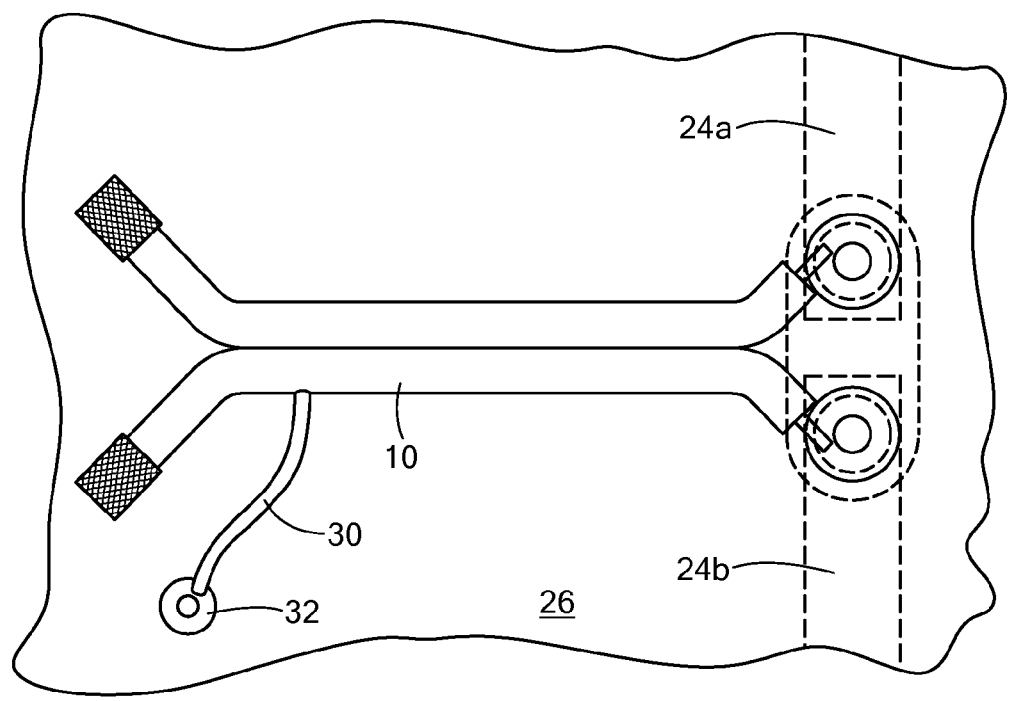
FIG. 2A is a top view a differential signal probe-differential signal launch structure according to the PRIOR ART.
Figure 2B:
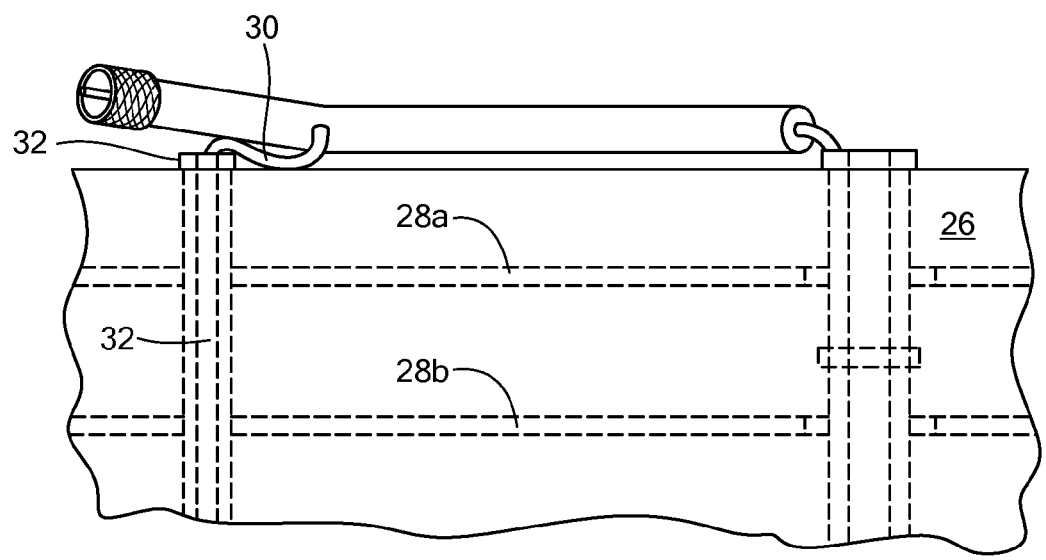
FIG. 2B is a side elevation view of the differential signal probe-differential signal launch structure of FIG. 2A according to the PRIOR ART.
Figure 3A:
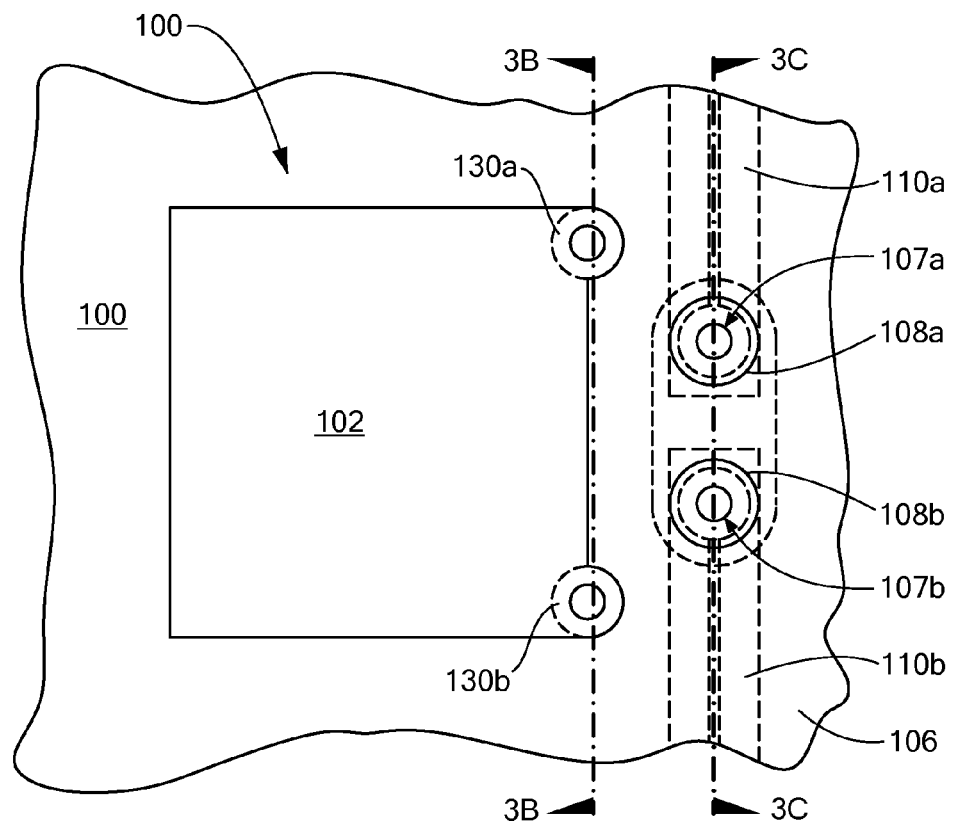
FIG. 3A is a top view a differential signal launch structure according to the invention.
Figure 3B:
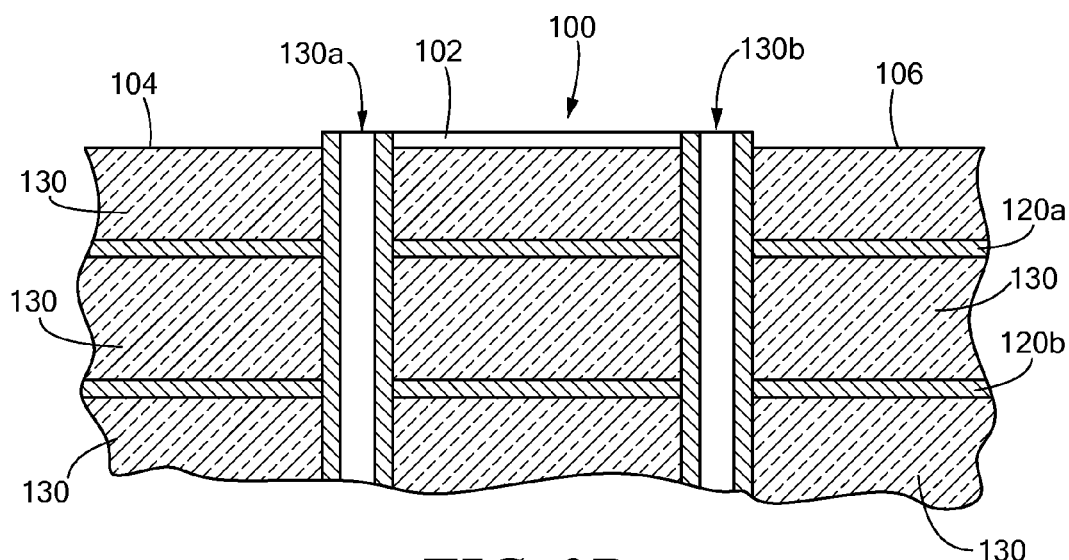
FIG. 3B is a side elevation cross sectional view of the differential signal launch structure of FIG. 3A, such cross section being taken along line 3B-3B of FIG. 3A.
Figure 3C:
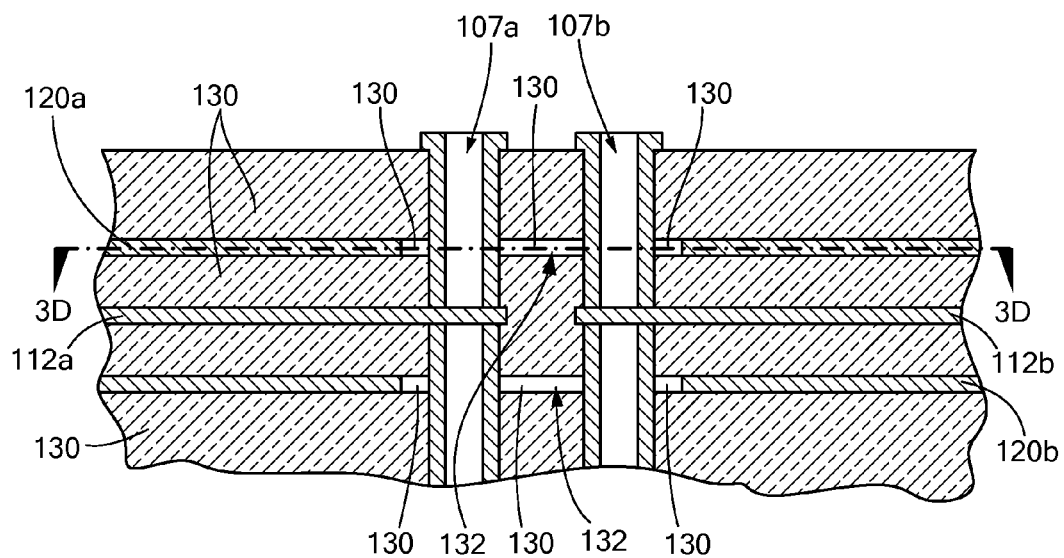
FIG. 3C is a side elevation cross sectional view of the differential signal launch structure of FIG. 3A, such cross section being taken along line 3C-3C of FIG. 3A.
Figure 3D:
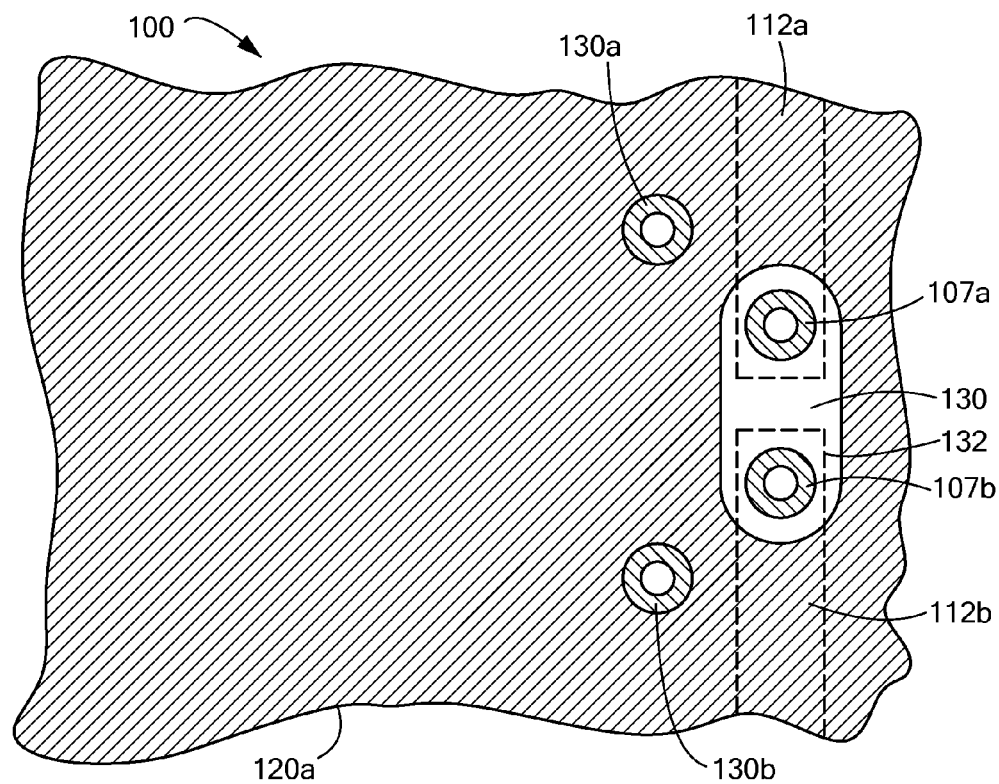
FIG. 3D is a side elevation cross sectional view of a ground plane conductor used in the differential signal launch structure of FIG. 3A, such cross section being taken along line 3D-3D of FIG. 3C.

Referring now to FIGS. 3A through 3D, a signal launch 100 is shown to include: a conductive ground pad 102 formed on the upper surface 104 of a printed circuit board (PCB) 106; a pair of signal vias 107a, 107b having contacts 108a, 108b disposed on the upper surface 104 of the printed circuit board (PCB) 106 and extending vertically through the PCB 106 to contact a corresponding one of a pair of horizontally extending signal conductors 112a, 112b, respectively as shown in FIG. 3C.

The horizontally extending signal conductors 112a, 112b are disposed between a pair of horizontally extending ground plane conductors 120a, 120b. It is noted that the horizontally extending signal conductors 112a, 112b and the pair of horizontally extending ground plane conductors 120a, 120b are electrically insulated by dielectric material 130 of the PCB 106. It is also noted that oval shaped regions 132 (FIG. 3D) are formed through regions of the ground plane conductors 120a, 120b to enable signal vias 107a, 107b to pass through the layers having the ground plane conductors 120a, 120b while electrically insulating each signal via 107a, 107b from each other and from each one of the ground plane conductors 120a, 120b, as shown.

Referring to FIG. 3B it is noted that the conductive pad 102 is electrically connected to the horizontally ground plane conductors 120a, 120b through a pair of vertically extending ground vias 130, 130 (see also FIGS. 3A and 3B)

Figure 4A:
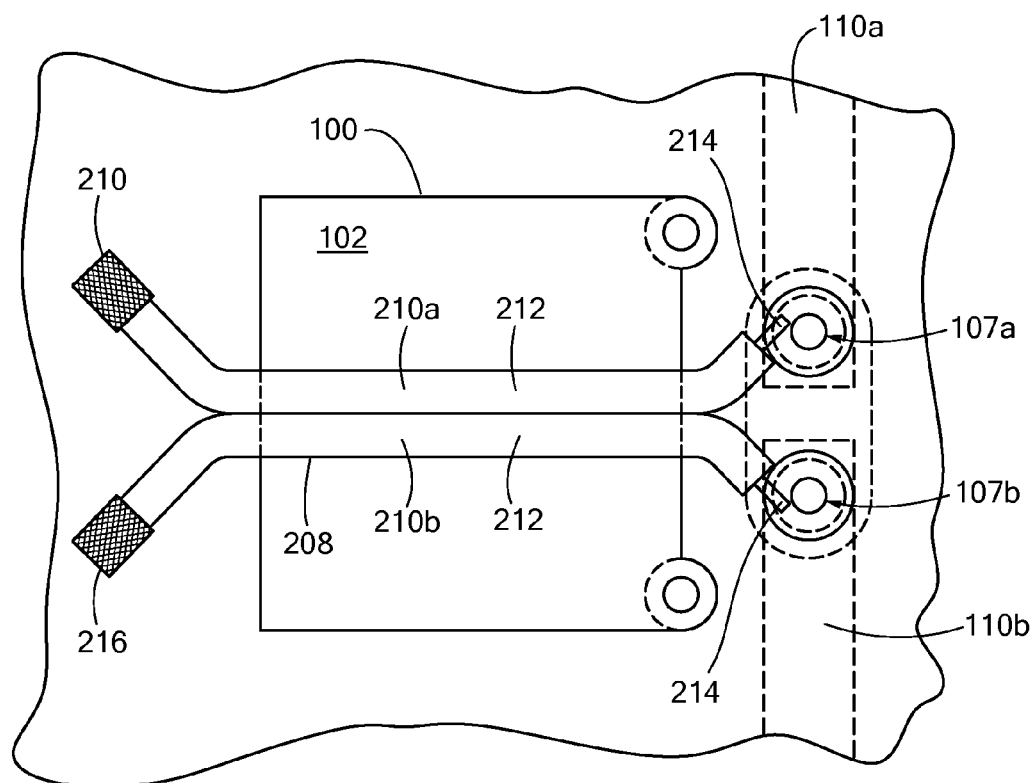
FIG. 4A is a top view a differential signal probe-differential signal launch structure according to the invention, such structure having as the signal launch thereof the signal launch structure of FIGS. 3A-3D.
Figure 4B:
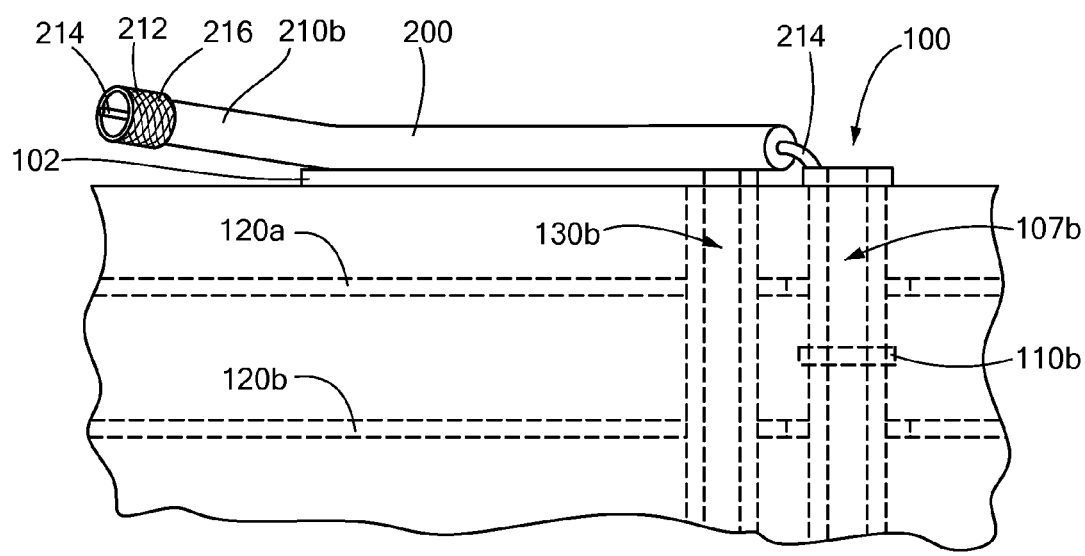
FIG. 4B is a side elevation view of the differential signal probe-differential signal launch structure of FIG. 4A.
Figure 5A:
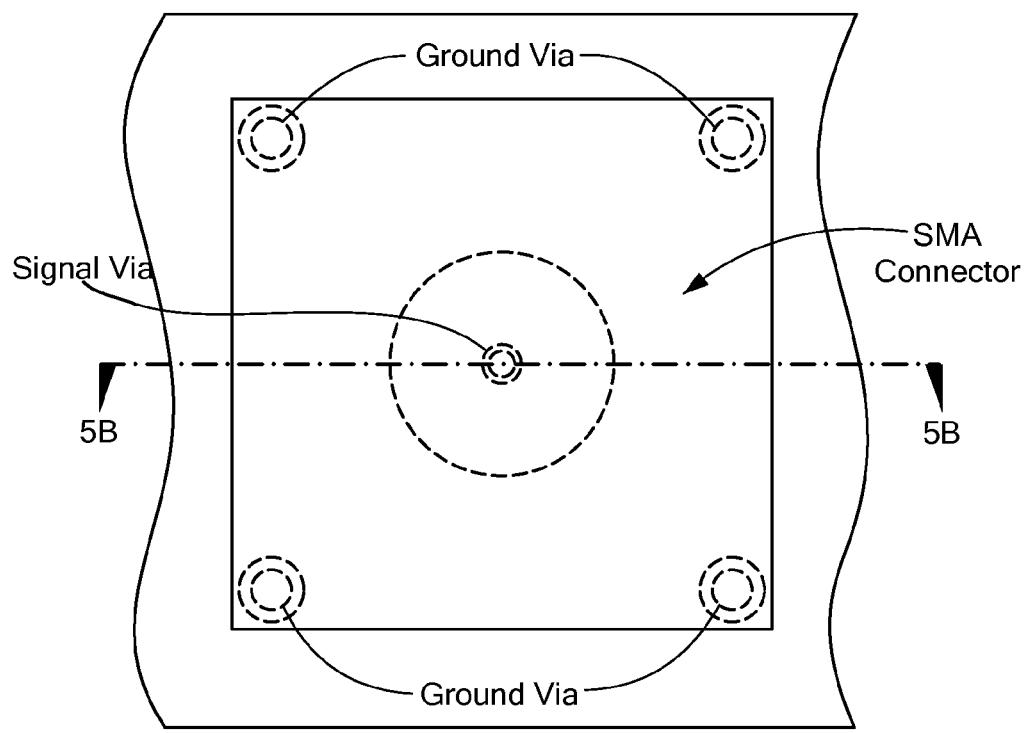
FIG. 5A is a top view a SMA signal launch according to the PRIOR ART.
Figure 5B:
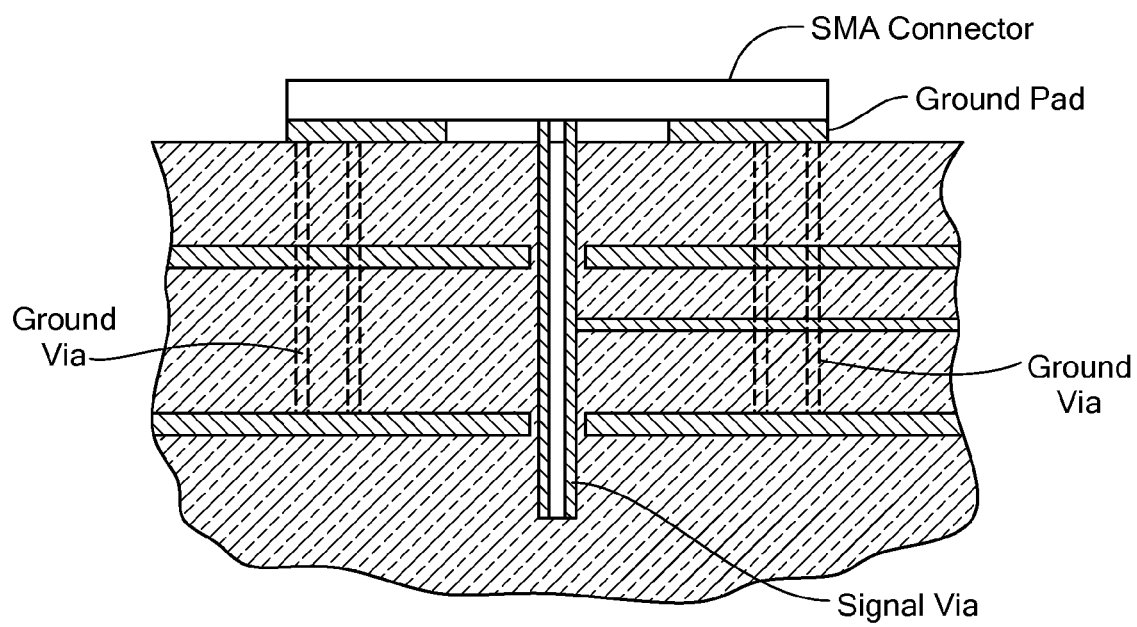
FIG. 5B is a side elevation view of the SMA signal launch of FIG. 5A, such view being taken along line 5B-5B of FIG. 5A.

Referring now to FIGS. 4A and 4B the signal launch 100 described above in connection with FIGS. 3A through 3D is shown connected to a differential signal probe 200. The signal probe 200 has a pair of semi rigid coax cables 210a, 210b, each have an outer conductive ground shield or housing 212 around a central, inner signal conductor or pin 214, such pin 214 being dielectrically insulated from the outer conductive ground shield, 212. Thus, the probe 200 is a differential signal probe having a conductive outer housing or shield 212 and the pair of signal conductors 214 deposed within and electrically insulated from each other and from the outer housing 212.

The distal end of the probe 200 has a plug/receptacle 216 to which an SMA cable, not shown, can be connected. The signal pins 214 are adapted to connect to the differential signal launch 100 described above in connection with FIGS. 3A through 3D. The outer conductive ground shield 212 is disposed on an electrically connected to, as by solder, the upper surface of the ground pad 102. Thus, the ground pad 102 is disposed beneath portions of the outer electrically conductive housing (i.e., outer conductive ground shield 212). Each one of the pair of a central, inner signal pins 214 is electrically connected to the signal terminals 108a, 108b, respectively, of the pair of vertically extending signal vias 107a, 107b, as shown.

The launch 100 described above in connection with FIGS. 3A-3D: guarantees a short return loop for signals; guarantees a ground which is easily identified and accessible; and guarantees a solid plane to which a probe can be permanently attached for consistent measurements.

A number of embodiments of the invention have been described. Nevertheless, it will be understood that various modifications may be made without departing from the spirit and scope of the invention. Accordingly, other embodiments are within the scope of the following claims.

What is claimed is:

1. A differential signal probe-differential signal launch structure, comprising:
    (A) a differential signal probe comprising:
        (i) a semi-rigid conductive outer housing; and
        (ii) a pair of signal pins disposed within and electrically insulated from each other and from the outer housing;
    (B) a signal launch comprising:
        (i) a printed circuit board, comprising:
            (a) a conductive ground pad disposed on the upper surface the printed circuit board;
            (b) a pair of spaced, horizontally extending signal conductors disposed within the printed circuit board;
            (c) a pair of signal vias having contacts disposed on the upper surface of the printed circuit board and electrically connected to a corresponding one of the pair of signal pins of the probe,
            (d) wherein the pair of signal vias extend vertically through the printed circuit board to contact a corresponding one of the pair of horizontally extending signal conductors;
            (e) a pair of horizontally extending ground plane conductors disposed within the printed circuit board;
            (f) wherein the pair of spaced, horizontally extending signal conductors is disposed between horizontally extending ground plane conductors;
            (g) a vertically extending ground via;
            (h) wherein the conductive pad is electrically connected to the horizontally ground plane conductors through the vertically extending ground via; and
    (C) wherein the conductive outer housing of the differential signal probe is disposed directly vertically above, on, and electrically connected to the conductive ground pad.

2. The signal probe recited in claim 1 wherein the conductive outer housing of the differential signal probe is disposed on, in contact with, and electrically connected to the conductive ground pad.

3. The signal probe recited in claim 1 wherein the conductive outer housing of the differential signal probe is disposed on, in direct physical contact with, and electrically connected to the conductive ground pad.

4. A signal probe comprising:
    (A) a pair of semi rigid coax cables, each having:
        an outer conductive ground housing; and
        an inner signal conductor being dielectrically insulated from the outer conductive ground housing;
    (B) a signal launch comprising:
        (i) a printed circuit board, comprising:
            (a) a conductive ground pad disposed on the upper surface the printed circuit board;
            (b) a pair of spaced, horizontally extending signal conductors disposed within the printed circuit board;
            (c) a pair of signal vias having contacts disposed on the upper surface of the printed circuit board and electrically connected to a corresponding one of the pair of the inner signal conductors of the probe;
            (d) wherein the pair of signal vias extend vertically through the printed circuit board to contact a corresponding one of the pair of horizontally extending signal conductors;

(e) a pair of horizontally extending ground plane conductors disposed within the printed circuit board;

(f) wherein the pair of spaced, horizontally extending signal conductors is disposed between horizontally extending ground plane conductors;

(g) a vertically extending ground via;

(h) wherein the conductive pad is electrically connected to the horizontally ground plane conductors through the vertically extending ground via; and (C) wherein the pair of semi rigid coax cables is disposed directly vertically above and electrically connected to the conductive ground pad.

5. The signal probe recited in claim 4 wherein the pair of semi rigid coax cables is disposed on, in contact with, and electrically connected to the conductive ground pad.

6. The signal probe recited in claim 4 wherein the pair of semi rigid coax cables is disposed on, in direct physical contact with, and electrically connected to the conductive ground pad.

* * * * *